(12) United States Patent
Matsumura (10) Patent No.: US 7,072,374 B2
(45) Date of Patent: Jul. 4, 2006

(54) RIDGE WAVEGUIDE SEMICONDUCTOR LASER DIODE

(75) Inventor: Hiroaki Matsumura, Tokushima (JP)

(73) Assignee: Nichia Corporation, Anan (JP)

(*) Notice: Subject to any disclaimer, the term of this patent is extended or adjusted under 35 U.S.C. 154(b) by 214 days.

(21) Appl. No.: 10/720,759

(22) Filed: Nov. 25, 2003

(65) Prior Publication Data

US 2004/0161010 A1 Aug. 19, 2004

(30) Foreign Application Priority Data

Nov. 25, 2002 (JP) ............................. 2002-340625
Aug. 28, 2003 (JP) ............................. 2003-305555

(51) Int. Cl.
*H01S 5/00* (2006.01)

(52) U.S. Cl. ................................ 372/46.01; 372/43.01
(58) Field of Classification Search ............. 372/43, 372/44, 45, 46, 46.01
See application file for complete search history.

(56) References Cited

U.S. PATENT DOCUMENTS

| 4,424,527 A | 1/1984 | Rao et al. |
| 5,429,680 A | 7/1995 | Fuschetti |
| 5,436,466 A * | 7/1995 | Ko et al. ..................... 257/13 |
| 6,067,309 A | 5/2000 | Onomura et al. |
| 6,838,701 B1 | 1/2005 | Sano |
| 2002/0034204 A1 | 3/2002 | Iwamoto et al. |
| 2004/0108804 A1* | 6/2004 | Hsu ........................... 313/495 |
| 2004/0124500 A1* | 7/2004 | Kawagoe ..................... 257/548 |
| 2004/0124550 A1 | 7/2004 | Kawagoe |
| 2004/0161010 A1* | 8/2004 | Matsumura ................... 372/46 |

FOREIGN PATENT DOCUMENTS

| EP | 0 714 126 A | | 5/1996 |
| JP | 03145178 A | * | 6/1991 |
| JP | 2000-58965 A | | 2/2000 |
| WO | WO 01/61804 A | | 8/2001 |
| WO | WO 02/084831 A | | 10/2002 |

OTHER PUBLICATIONS

Sugiyama, K. "Deterioration Mechanisms in Metallization of Si Devices" Sanken Technical Report, 1995, pp. 19-27, vol. 27, No. 1, Sanken Electric Co., Ltd., Japan.

Gocke, O. H. et al. "Effects of Annealing on X-Ray-Amorphous CVD W-Si-N Barrier Layer Materials" Thin Solid Films, Sep. 1999, pp. 149-156, vol. 353, Nos. 1-2, Elsevier Science S. A., Lausanne, CH.

* cited by examiner

*Primary Examiner*—Armando Rodriguez
*Assistant Examiner*—Dung Nguyen
(74) *Attorney, Agent, or Firm*—Smith Patent Office (57) ABSTRACT

A ridge waveguide semiconductor laser diode is disclosed that comprises an n-type semiconductor layer, a p-type semiconductor layer having a ridge forming a waveguide and an active layer disposed between the n-type semiconductor layer and the p-type semiconductor layer. The laser diode also includes a first protective insulating layer partially covering the ridge so as to expose at least a portion of a top face of the ridge, a p-side ohmic electrode in ohmic contact with the portion of the ridge, a p-side pad electrode disposed so as to electrically connect to the p-side ohmic electrode; and an intermediate layer is disposed between the p-side ohmic electrode and the p-side pad electrode so as to cover a portion of the p-side ohmic electrode including an area that covers the top face of the ridge. The intermediate layer can be a diffusion prevention layer for preventing diffusion of a low melting point. The laser diode can also include a second protective insulating layer disposed on a portion of the first protective insulating layer. When the second protective insulating layer is used, the intermediate layer and the second protective insulating layer may have the same composition.

20 Claims, 5 Drawing Sheets

RIDGE WAVEGUIDE SEMICONDUCTOR LASER DIODE

BACKGROUND OF THE INVENTION

1. Field of the Invention

The present invention relates to a ridge waveguide semiconductor laser diode, and particularly, to a ridge waveguide structure effective for improving reliability after mounting a ridge waveguide semiconductor laser diode.

2. Description of the Related Art

A semiconductor laser diode has recently been widely used for a light source for an optical disk such as a DVD, and a light source for medical equipment, processing equipment, optical fiber communication and the like. Specifically, a semiconductor laser element comprising a nitride semiconductor (such as an $In_xAl_yGa_{1-x-y}N$ semiconductor, where $0 \leq x$, $0 \leq y$, and $x+y \leq 1$) attracts attention as a semiconductor laser element capable of emitting light in the range from relatively short-wavelength ultraviolet to red.

With regard to the stripe structure for controlling a transverse oscillation mode, the ridge waveguide structure is frequently employed in such semiconductor laser diodes, because of the capability to realize gain guiding and index guiding simultaneously. Also, since a nitride semiconductor laser diode is frequently constructed on a sapphire substrate whose thermal conductivity is low, it is advantageous to mount the nitride semiconductor laser diode by a face-down bonding (junction-down) method where the p-side electrode, which is close to the active layer, is placed downward to increase the heat release from the laser element.

In addition, even in the case where a nitride semiconductor substrate other than a foreign substrate such as a sapphire substrate is used, it is advantageous to use a submount having a larger thermal conductivity than the substrate, or to mount the p-type layer side down by the face-down bonding method in order to inhibit deterioration of the semiconductor element due to heat generation by its high power output.

Figure 5:
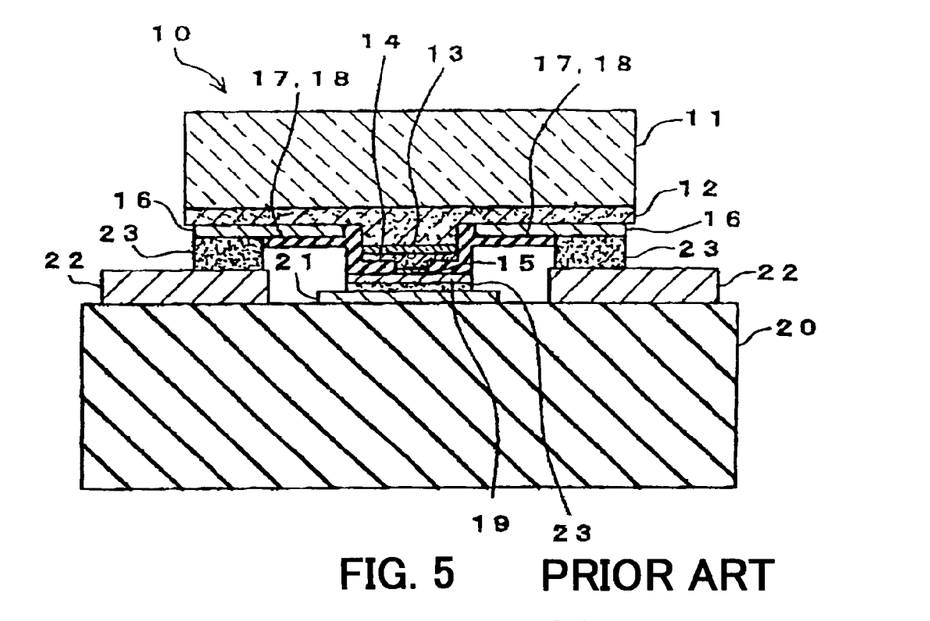
FIG. 5 is a schematic cross sectional view showing an example of a conventional ridge waveguide nitride semiconductor laser diode.

FIG. 5 is a schematic cross sectional view showing a ridge waveguide laser diode attached by the face-down bonding method according to Japanese Unexamined Patent Publication No. 2000-58965. The nitride semiconductor laser diode 10 shown in FIG. 5 is bonded face-down on the mounting substrate 20 by a conductive joining material such as solder 23. The nitride semiconductor laser diode 10 is a ridge waveguide laser having a layer structure. In this structure, an n-type nitride semiconductor layer 12, an active layer 13, and a p-type nitride semiconductor layer 14 are sequentially formed on the substrate 11, and a stripe ridge 14a is constructed in the p-type nitride semiconductor layer. In the nitride semiconductor laser diode 10, the n-side electrode 16, the p-side electrodes 15 and 19 are bonded to the electrodes 21 and 22 on the mounting substrate 20 by a conductive joining material such as solder 23.

However, the conventional ridge waveguide semiconductor laser diodes described above have problems such as defects in the initial laser quality that occur after bonding the laser diode 10 on the mounting substrate 20, or deterioration in their lifetime.

SUMMARY OF THE INVENTION

It is therefore an object of the present invention to provide a ridge waveguide semiconductor laser diode having a structure capable of preventing defects in laser quality that occur by mounting, or deteriorating effects on its lifetime.

The inventors have discovered that a defect in the laser quality and the lifetime deterioration that occurs after mounting a ridge waveguide laser diode are caused by an abnormality occurring in the ridge. The inventors found that those problems are caused especially by the diffusion of a conductive joining material used for bonding to the p-side ohmic electrode, the exfoliation of the protective insulating layer at the ridge, or the exfoliation of the p-side electrode.

Figure 6:
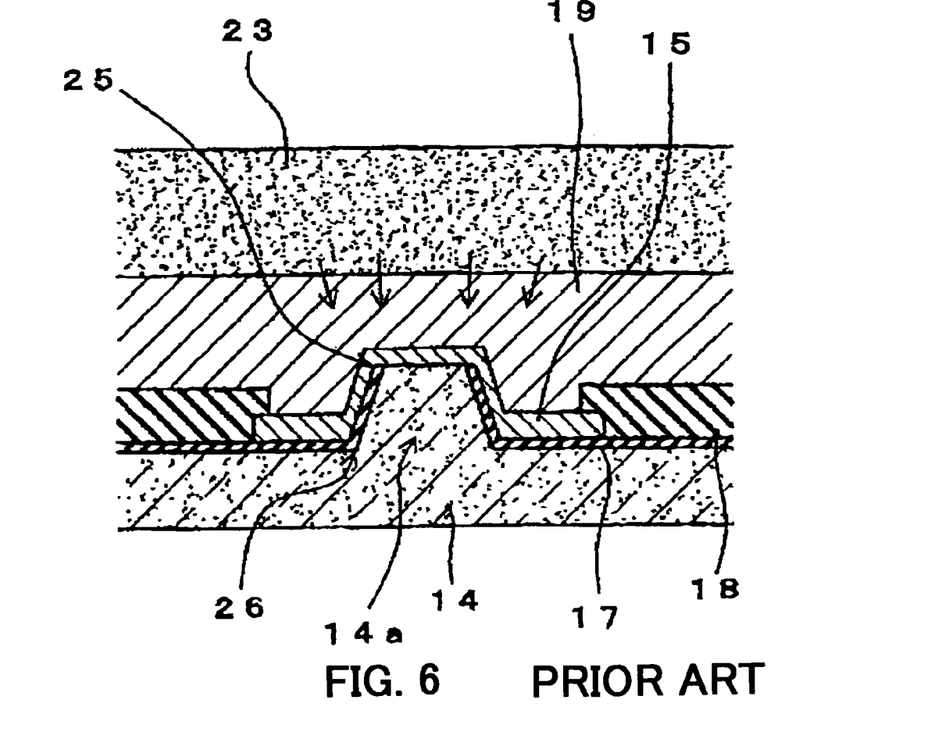
FIG. 6 is a schematic cross sectional view showing the structure of the ridge portion of the conventional nitride semiconductor laser diode.

This issue is explained by using FIG. 6. FIG. 6 is a partial sectional view showing an enlarged ridge portion of a nitride semiconductor laser diode. FIG. 6 shows the drawing where the top and bottom of the drawing shown in FIG. 5 are reversed. As shown in FIG. 6, the ridge 14a for constructing the waveguide is formed in the p-type nitride semiconductor layer 14 of the nitride semiconductor laser diode 10, and the first protective insulating layer 17 is disposed so as to expose the top face of the ridge 14a. A material having an optical refractive index significantly different from the optical refractive index of ridge 14a is used for the first protective insulating layer. The ridge 14a confines light based on the difference in the optical refractive indexes. Further, the p-side ohmic electrode 15 is disposed on the ridge 14a so as to cover the entire portion thereof, and the ohmic junction is formed between the p-side ohmic electrode and the p-type nitride semiconductor 14 exposed on the top face of the ridge 14a. Also, the second protective insulating layer 18 is disposed on the first protective insulating layer 17 away from the ridge 14a.

In this ridge 14a, the junction between the p-side ohmic electrode 15 and the mounting substrate 20 is formed as follows: First, the p-side pad electrode 19 is disposed on the p-side ohmic electrode 15. This p-side pad electrode is composed of a metal having a good junction property with the conductive joining material 23, and connected to the electrode on the mounting substrate by the conductive joining material 23. This joint is formed by heating the conductive joining material beyond its melting point while pressing the laser diode element against the mounting substrate.

The inventors conducted various investigations on the laser diode elements which developed deficiency, and discovered that the metallic element (such as Sn) in the conductive joining material 23 obstructs the ohmic contact between the p-side ohmic electrode 15 and the p-type nitride semiconductor 14. This is because the metallic element reaches the p-side ohmic electrode 15 which covers the ridge 14a. Although a low melting point metal such as solder is generally used for a conductive joining material 23, it is presumed that by the heat applied in the bonding process, the low melting point metal (such as Sn) diffuses into the p-side pad electrode 19 and reaches the p-side ohmic electrode 15. The low melting point metal (such as Sn) obstructs the ohmic contact between the p-side ohmic electrode 15 and the p-type nitride semiconductor when reaching the p-side ohmic electrode 15, and this increases the contact resistance.

The inventors also discovered that the exfoliation also causes a defect in the laser quality and deterioration in the lifetime of the laser diode. The exfoliation occurs between the p-type nitride semiconductor layer 14 and the first protective insulating layer 17, or between the first protective insulating layer 17 and the p-side ohmic electrode 15, at the side face of the ridge 14a of the p-type nitride semiconductor layer. The ridge 14a which projects the furthest in the structure of the laser chip receives a high stress while bonding the laser chip to the mounting substrate by the face-down bonding method. Moreover, as is the general tendency in the layer making process, the thickness of the first protective insulating layer tends to be formed thinner than other portions on the side face of the ridge 14a. This is especially true at the corner 25 which connects the side face and the top face of the ridge 14a, or at the corner 26 which connects the side face and the bottom face of the ridge 14a. Also, a protective insulating layer in general has poor adhesion characteristics with the nitride semiconductor or a metallic material. Consequently, the exfoliation occurs between the first protective insulating layer 17 and the p-type nitride semiconductor layer 14, or between the first protective insulating layer 17 and the p-side ohmic electrode 15, by the heat or the pressure applied during the bonding of the laser chip to the mounting substrate. When an exfoliation occurs in the first protective insulating layer 17, the optical refractive index around the ridge 14a becomes abnormal and as a result, the optical confinement function of the ridge 14a will be significantly obstructed.

The problem described above is not limited to the case where the ridge waveguide semiconductor laser diode element is assembled by the face-down bonding method. A quite similar problem will occur when the p-side pad electrode is bonded by a conductive joining material including a low melting point metal, in the vicinity of the ridge portion of the laser diode element. In addition, the deterioration of adhesion between the electrode (especially the p-side electrode) and the protective insulating layer or the semiconductor layer may occur when a high temperature is applied in a process other than mounting. This deterioration of adhesion will result in the deterioration of the characteristics of the laser diode element.

The ridge waveguide semiconductor laser diode according to the present invention includes an active layer disposed between an n-type semiconductor layer and a p-type semiconductor layer. A ridge is constructed in the p-type semiconductor layer. A protective insulating layer covers the ridge so as to expose at least a portion of the top face thereof. A p-side ohmic electrode is provided which has an ohmic connection with the exposed ridge portion, and the p-side pad electrode is electrically connected to the p-side ohmic electrode. An intermediate layer (which is sometimes called a diffusion prevention layer herein) is also added which is capable of preventing the above mentioned diffusion of the low melting point metal. This intermediate layer is disposed between the p-side ohmic electrode and the p-side pad electrode, so as to cover at least the ridge portion which is exposed from the protective insulating layer.

The diffusion of the low melting point metal into the ridge portion can be prevented by providing the intermediate or diffusion prevention layer between the p-side ohmic electrode and the p-side pad electrode. Consequently, the obstruction of the ohmic contact between the p-side ohmic electrode and the p-type semiconductor layers can be prevented.

It is preferable to form the intermediate or diffusion prevention layer so that it covers the side face of the ridge so as to prevent the exfoliation of the protective insulating layer at the side face of the ridge. The concentration of heat and pressure focused on the protective insulating layer can be reduced by extending the intermediate layer over the side face of the ridge to cover portions susceptible to exfoliation such as the corner connecting the side face of the ridge and the top face, and the corner connecting the side face of the ridge and the bottom face.

Also, by using a material having a weak adhesion to the electrode (e.g. oxides) for the intermediate layer, the effects of reducing the stress concentration applied by face-down mounting by covering the corner portions can be obtained and the effects of enhancing the flexibility to the electrode structure regardless of the mounting conformation can also be obtained. Thus, the mechanical tolerance to a thermal structural change caused by thermal expansion or the like can be improved.

The strong bonding between the metals can be reduced by interposing a material having a weak adhesion to the metallic materials compared with the case where the interface between the p-side ohmic electrode and the p-side pad electrode are connected by the metal-metal bonding over a wide area including the ridge. As a result, the flexibility of the internal structure of the entire region (i.e. from the p-type contact layer to the p-side pad electrode) involving ohmic contact can be enhanced against heat or physical external force, so that the stress applied to the ohmic junction portion can be dispersed (spread).

Furthermore, in the case where such an intermediate or diffusion prevention layer has a weak adhesion because it is an insulator, the device can be operated without a problem, as long as the adhesion at the ohmic junction is secured. This happens even when the interface between the diffusion protection layer and the p-side ohmic electrode or the p-side pad electrode exfoliate.

Also, it is preferable to dispose the intermediate layer having approximately the same width and length on the both sides of the ridge, so that the electric current can be supplied uniformly to the ridge. Specifically, when the ridge width is wide or a plurality of ridges are disposed, thermal loading or mechanical loading can be dispersed uniformly in the lateral direction. In either case, the intermediate layer functions as a buffer layer or a diffusion prevention layer. Therefore, uneven distribution of the light density can be prevented, and the effects such as controlling catastrophic optical damage (COD) or preventing partial emission can be obtained with ease.

As described above, the intermediate layer can have at least two different functions, as a diffusion prevention layer and as a buffer layer which prevents exfoliation, in other words, adjusts adhesion. In this case, it is possible to form not only a single layer having the both functions, but it is also possible to form a multilayer structure comprising more than two layers. Therefore, various combinations of layers can be formed according to the requirements. For example, a combination of a buffer layer disposed on a diffusion prevention layer, a diffusion prevention layer disposed on a buffer layer, or a buffer layer disposed on another buffer layer, can be selected. Specifically, when adhesion is considered, the most suitable materials can be selected according to the material used for each interfaces of the p-side ohmic electrode and the p-side pad electrode.

The combination of elements such as $Ti/SiO_2$ or $Ni/SiO_2$ can be used for a multilayer structure where a diffusion prevention layer is disposed on a buffer layer. $SiO_2$ alone can satisfy both the diffusion prevention function and the buffer function (adhesion adjustment function). However, when a material which is resistant to oxidation is used for the electrode, for example, when Ni/Au or Ni/Au/Pt are used as the top layer of the ohmic electrode, the adhesion with the oxide is poor. Therefore, a desired shape and thickness of the layer may be difficult to obtain when an oxide layer is formed. In this case, a layer is provided to enhance the adhesion between the oxide layer and the ohmic electrode, so that an oxide layer having a desired shape and thickness can be formed.

Thus, the adhesion of the entire intermediate layer can be adjusted by forming the intermediate layer to strengthen adhesion of the diffusion prevention layer, rather than to function as a buffer layer. In addition, the combinations of oxide layer/oxide layer such as $SiO_2/TiO_2$, oxide layer/metal such as $SiO_2/Si$, metal/oxide layer such as $Pt/SiO_2$, nitride/oxide such as $AlN/Al_2O_3$, or metal/metal such as Pt/Rh, are used. Furthermore, the intermediate layers disposed on the top of the ridge and the side face can be of the same function, or of different functions as a buffer layer and a diffusion prevention layer, according to the shape of the layer. It is preferable that fewer processes are required to form a multilayer structure when all layers have the same shape. However, a multilayer structure having each layer with a different shape can be formed according to the object and the processes, or the materials. For example, a material having a light absorption property is used for the layer to strengthen the adhesion of the diffusion prevention layer made of the oxide layer as described above. In this case, the adhesion can be adjusted while maintaining the light properties, by disposing the intermediate layers only to places slightly away from the ridge.

Thus, by improving the flexibility of the ohmic junction portion, the difference of the thermal expansion coefficients between the laser diode element and the mounting substrate such as a stem or a submount can be reduced while face-down mounting, and the mounting deficiency can be lowered.

During face-down bonding, the adhesion between the laser diode element and the mounting substrate is affected by the bonding material or the thermal expansion coefficients of the mounting substrate or the like. Therefore the adhesion can also be improved by selecting those materials.

If the bonding material or the mounting substrate is selected by other factors, the difference in the thermal coefficients may become large. However, as in the present invention, these materials can be used by improving the flexibility of the laser diode element against the structural change corresponding to the difference in the thermal coefficients or the like. Thus, the thermal tolerance can be improved more effectively by providing the diffusion prevention layer.

The material for the diffusion prevention layer is not specifically limited, and any of an insulator, a semiconductor, or a metal can be used as long as it is capable of preventing the low melting point metals from diffusing.

An oxide, a nitride, or a high melting point metal is the preferable material for the diffusion prevention layer. For example, an oxide or an nitride of Si, Al, Rh, Zr, Ti, Zn, Ga, and Nb, a metal such as platinum group metals (Pt, Pd, Rh, Ir, Ru, and Os), a semiconductor layer such as InN, AlN, GaN, mixed crystal thereof, such as AlInGaN, GaAs, GaP, or InP, or Si, and SiC can be used. Among them, it is preferable to use $SiO_2$, $TiO_2$, $ZrO_2$, AlN, SiN, GaN, AlGaN, InGaN, and Pt, and the like.

It is necessary to form the diffusion prevention layer so that a portion of the p-side ohmic electrode is exposed to maintain the electric contact between the p-side ohmic electrode and the p-side pad electrode when the diffusion prevention layer is an insulator or a semiconductor.

When the diffusion prevention layer chiefly comprises electroconductive materials such as the metals, the conductive path becomes the same as in the case where the diffusion prevention layer is not disposed. The preferable material for the diffusion prevention layer can also function as a barrier layer for preventing the interlayer diffusion in the electrode layers where a plurality of materials are laminated. However, in the present invention, the diffusion prevention layer is not formed over the entire face of the electrodes, but is only formed in the vicinity of the ridge. This is different from the diffusion prevention layer in the electrode layers described above.

According to such a configuration, the optical characteristic in the vicinity of the ridge can be compensated. For example, in the case where a diffusion prevention layer comprising Pt is disposed in the vicinity of the ridge, the waveguide loss will be small because Pt hardly absorbs the emission wavelength from the emission layer. This effect can also be obtained when the p-side pad electrode contains Pt.

However, when the width of the diffusion prevention layer is limited so as to bring the p-side ohmic electrode into contact with the p-side pad electrode in the region slightly away from the ridge (the region where the primary mode occurs), the emission wavelength from the emission layer can be absorbed in the p-side pad electrode comprised of Ni/Au for instance. By this construction, the horizontal transverse mode of a high order can be absorbed, and only the fundamental mode can be extracted. Such an effect can not be obtained when the barrier layer (for instance, Pt) is included in the p-side pad electrode, and can be obtained by forming the diffusion prevention layer using an electroconductive material with the width narrower than the p-side pad electrode, as in the present invention.

Moreover, when the diffusion prevention layer is an insulative material comprised mainly of the oxide, it becomes easy for the electric current to flow in the entire area of the stripe. The conductive path from the p-side pad electrode to the p-side ohmic electrode takes a route that is not through the upper portion of the ridge and it follows a route that extends to the lateral direction of the stripe ridge.

When the p-side ohmic electrode and the p-side pad electrode are formed in separate processes, the length (the direction of the stripe) differ. Especially, the p-side pad electrodes tend to be made shorter than the p-side ohmic electrodes. Therefore, the edge of the p-side ohmic electrode may not be bound directly to the p-side pad electrode. In this case, the electric current can hardly reach to the edge portion of the p-side ohmic electrode and to the semiconductor layer beneath it, and this results in the formation of a region with weak emission.

Consequently, the electric current concentrates at the p-side ohmic electrode beneath the p-side pad electrode. This action forms a region with strong emission, and therefore, the uneven emission will become exaggerated. This inconsistency in the electric current route can be improved by forming the insulative diffusion prevention layer as in the present invention, so that uniform supply of electric current to the entire stripe region can be made with ease.

When the intermediate layer is an oxide, the diffusion of the low melting point metal can be prevented at the face-down mounting. In addition, the heat resistance can be improved even when it is mounted face-up. It is thought that this occurs because oxygen exists in the interface since the p-side ohmic electrode and the p-side pad electrode are formed in different processes (although the details are not certain). The laser diode element is subjected to heat of about 300° C. in the die bonding, not only in the face-down mounting process but also in the face-up mounting process. By being exposed to such high temperatures, the laser diode element becomes susceptible to characteristic deterioration such as ohmic characteristics deterioration, partial emission (uneven emission), or Vf rise.

One possible cause for the ohmic characteristics deterioration is the diffusion of the oxygen. The oxygen that exists originally in the interface between the p-side ohmic electrode and the p-side pad electrode diffuses into the region outside of the interface (e.g. outside) or the like, and this results in the deterioration of the ohmic characteristics. The loss in the concentration of the oxygen, which is thought to aid the ohmic characteristics, can be supplemented by providing an oxide as a diffusion prevention layer at the interface between the p-side ohmic electrode and the p-side pad electrode. As a result, the deterioration in the ohmic characteristics due to the movement (diffusion) of the oxygen caused by heating in the mounting process can be prevented, and a laser diode element having excellent thermostability can be obtained.

Moreover, it is preferable that the above-mentioned diffusion prevention layer comprises the same material as a second protective insulating layer, in the case where the second protective insulating layer is disposed on the first protective insulating layer (for instance, a layer which insulates and protects the region other than the region for forming the n-electrode). By this construction, the diffusion prevention layer can be formed only by making a change to the mask shape of the photolithography that forms the second protective insulating layer, without adding a new process.

The conductivity is not specifically restricted when the intermediate layer is used as a buffer layer to reduce or adjust the adhesion. Therefore, a conductive material, an insulative material, or a semiconductor can be used. The preferable material for the intermediate layer is an insulative material made of a metal oxide layer, and the adhesion between the ohmic electrode made of a metal material and the pad electrode can be reduced by using such a material.

The semiconductor laser diode element according to the present invention is constructed as described above. This structure prevents diffusion of the conductive joining material, used for mounting, toward the p-side ohmic electrode. It also prevents the exfoliation of the protective insulating layer at the ridge, and the exfoliation of the p-side electrode. Therefore, malfunctions in the laser performance caused by mounting or lifetime deterioration can be prevented in the ridge waveguide semiconductor laser diode.

DETAILED DESCRIPTION OF THE PREFERRED EMBODIMENTS

The preferred embodiments of the present invention will now be described with reference to the accompanying drawings.

Embodiment 1

Figure 1:
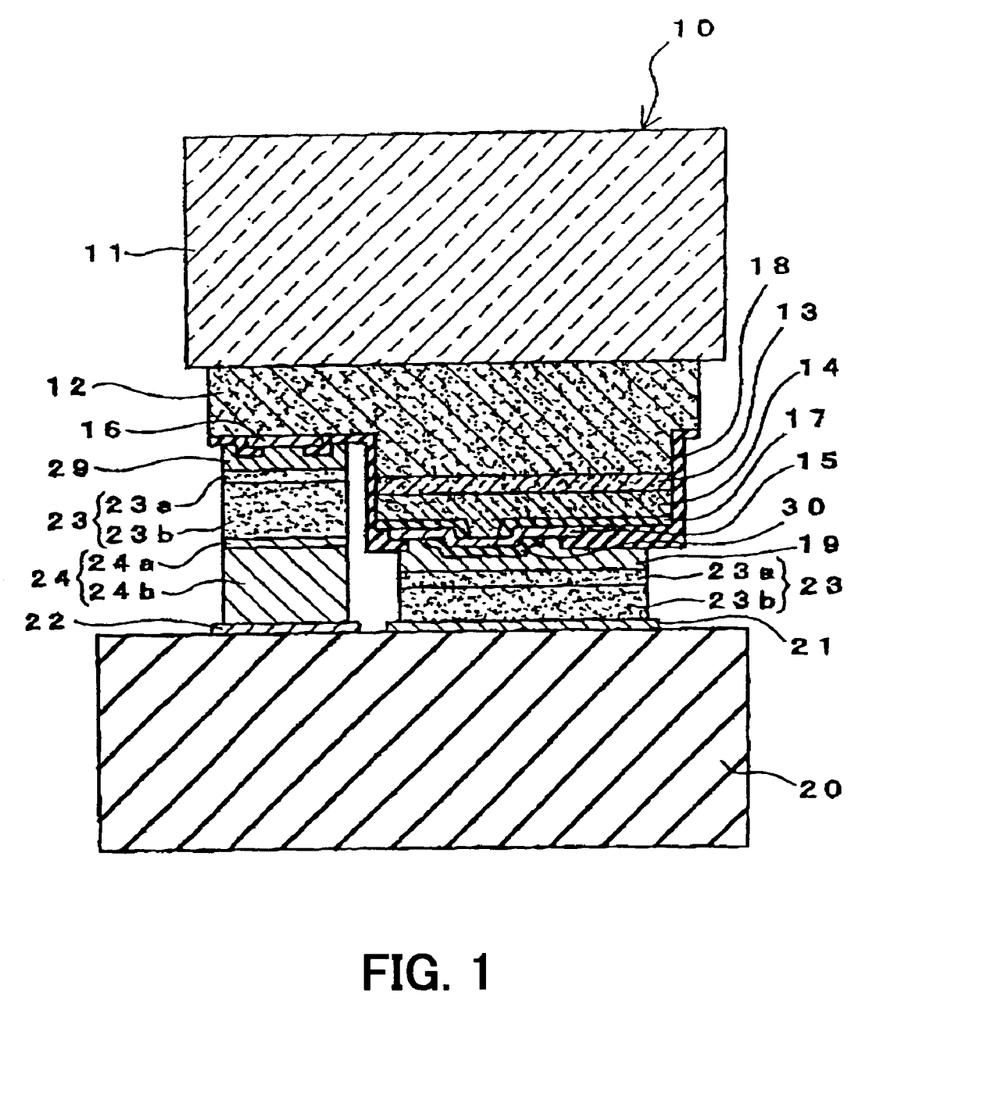
FIG. 1 is a schematic sectional view showing the ridge waveguide laser diode being mounted on the mounting substrate according to a first embodiment of the present invention.

FIG. 1 is a schematic cross sectional view showing the ridge waveguide semiconductor laser diode according to the present invention. In FIG. 1, the nitride semiconductor laser diode 10 is mounted face down on the mounting substrate 20 by using the conductive joining material 23 such as a solder.

The nitride semiconductor laser diode 10 is a ridge waveguide laser diode. The n-type nitride semiconductor layer 12, the active layer 13, and the p-type nitride semiconductor layer 14 are sequentially disposed on an insulative substrate 11 such as sapphire. The stripe-shaped ridge is formed in the p-type nitride semiconductor layer. The n-type nitride semiconductor layer 12 and the p-type nitride semiconductor layer 14 respectively have as their main function to supply the electron and the hole to the active layer 13. They are generally comprised of the n-type nitride semiconductor and the p-type nitride semiconductor.

In the nitride semiconductor laser diode 10, the n-side electrodes 16 and 29, and the p-side electrodes 15 and 19 are bonded to the electrodes 21 and 22 of the mounting substrate 20 using the conductive joining material 23.

In the present embodiment, the pre-bonding conductive joining material 23 comprises the two layers, as shown in FIG. 1: the low melting point metal layer 23a comprised of Sn, Pb, Ag, Bi, Cu, In, Zn and the like, and the protective layer 23b comprised of a difficult to oxidize metal such as Au, Pt.

The protective layer 23b is formed into a thin layer by the heat and the pressure of bonding, and has a function to prevent the pre-bonding low melting point metal 23a from being oxidized in air. That is, by the heat and the pressure in the bonding, the protective layer 23b breaks and the low melting point metal melts. Thus the nitride semiconductor laser diode 10 and the electrodes of the mounting substrate 20 are connected.

The n-side electrodes 16 and 29 are disposed on the n-type nitride semiconductor layer 12 which is exposed by partially removing the p-type nitride semiconductor layer 14 and the active layer 13, so that the height where the n-side electrodes 16 and 29 are disposed is different from the height where the p-side electrodes 15 and 19 are disposed.

Consequently, the electrode 24 consists of two layers: the Au layer 24b and the Pt layer 24a. These layers are disposed on the pad electrode 22 of the mounting substrate 20 side, so as to compensate for the difference in height between the n-side electrodes and the p-side electrodes.

Figure 2:
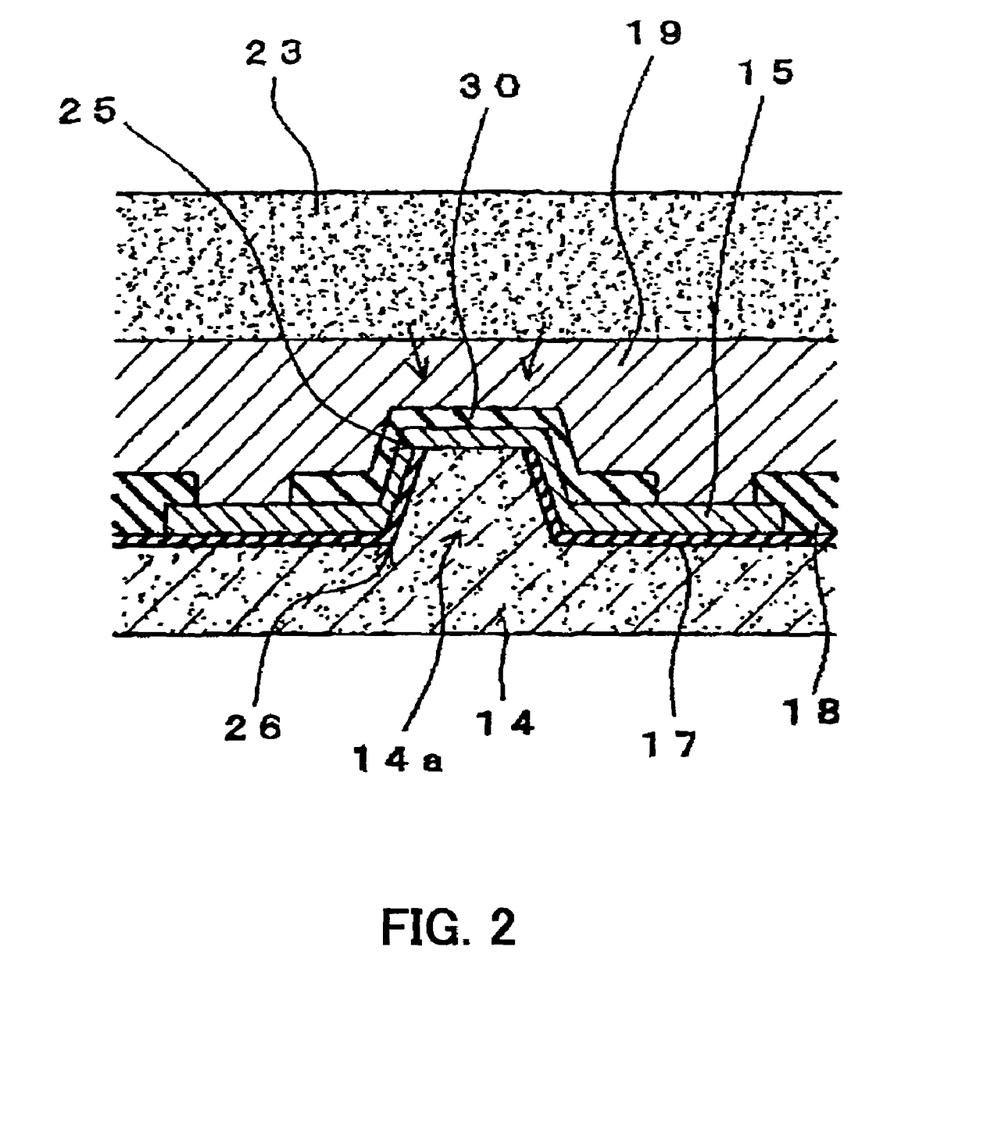
FIG. 2 is a schematic sectional view showing the structure of the ridge region of the ridge waveguide laser diode according to the first embodiment of the present invention.

The structure in the vicinity of the ridge portion will be described in detail with reference to FIG. 2. FIG. 2 is a partially enlarged cross-sectional view of the structure in the vicinity of the ridge portion shown in FIG. 1. The view shown in FIG. 2 shows an upside down version of FIG. 1. As shown in FIG. 2, the ridge 14a for waveguide is formed in the p-type nitride semiconductor layer 14 in the nitride semiconductor laser diode 10. The first protective insulating layer 17 is disposed on the p-type nitride semiconductor layer other than the top face of the ridge 14a, so as to expose the top face.

A material having an optical refractive index largely different from the optical refractive index of ridge 14a is used for the first protective insulating layer. The ridge 14a confines light based on the difference in the optical refractive indexes.

Further, the p-side ohmic electrode 15 is disposed on the ridge 14a so as to cover the entire portion thereof. The ohmic junction is formed between the p-side ohmic electrode and the p-type nitride semiconductor 14 exposed on the top face of the ridge 14a. Also, the second protective insulating layer 18 is disposed on the first protective insulating layer 17 away from the ridge 14a.

The diffusion prevention layer 30 is disposed between the p-side ohmic electrode 15 and the p-side pad electrode 19, so as to cover the top face of the ridge 14a, which is exposed between the ends of the first protective insulating layer 17. That is, the diffusion prevention layer 30 is disposed so as to cover at least the ohmic junction between p-side ohmic electrode 15 and p-type gallium nitride semiconductor layer 14.

The conductive joining material 23 includes a low melting point metal such as Sn, Pb, Ag, Bi, Cu, In, and Zn. By the heat or the pressure applied in bonding, the low melting point metal diffuses from the conductive joining material and reaches the p-side ohmic electrode 15. The diffusion prevention layer 30 disposed by this means substantially prevents the low melting point metal from reaching the p-side ohmic electrode 15. Therefore, connection defects in the p-side ohmic electrode that occur by mounting the nitride semiconductor laser diode or subsequent electrification can be prevented.

Moreover, the diffusion prevention layer 30 is disposed so as to cover the top face and the entire side face of the ridge 14a. The layer 30 is disposed to especially cover the edge 25 connecting the top face and the side face, and the edge 26 connecting the top face and the bottom of the ridge.

There is a general tendency in the semiconductor production process that the resulting thickness of the first protective insulating layer 17 and the p-side ohmic electrode 15 are locally thinner at the corners 25 and 26 than in the other portions.

As a result, a narrow depression occurs in the first protective insulating layer 17 or in the p-side ohmic electrode at the corners 25 and 26. The diffusion prevention layer 30 fills those depressions and modifies the heat and pressure at the corners 25 and 26. This structure prevents exfoliation of the first protective insulating layer 17 from the p-type gallium nitride semiconductor 14 or the p-side ohmic electrode 15 from the first protective insulating layer 17. Thus, the malfunctions in the optical confinement caused by the exfoliation around the ridge portion 14a can be prevented.

The material of the diffusion prevention layer 30 is not especially limited. Any one of an insulator, semiconductor, metal, or a material which can prevent the diffusion of a low melting point metal from the conductive joining material 23 can be used. However, a material which inhibits the ohmic junction of the p-side ohmic electrode can not be used for the diffusion prevention layer 30. For example, the content of the diffusion prevention layer 30 must be controlled, so as to avoid containing a low melting point metal such as Sn, Pb, Ag, Bi, Cu, In, or Zn, in a concentration capable of inhibiting the ohmic contact of the p-side ohmic electrode 15.

Also, it is preferable that the material of the diffusion prevention layer 30 is nonreactive with the p-side ohmic electrode 15. An oxide, a nitride, a high melting point metal, or the like are preferable materials for the diffusion prevention layer. For example, it is preferable to use a material such as $SiO_2$, AlN, SiN, GaN, AlGaN, InGaN, and Pt for the diffusion prevention layer.

Especially, the diffusion prevention layer 30 and the second protective insulating layer 18 can be formed simultaneously, when the diffusion prevention layer 30 is formed by an insulator such as $SiO_2$. That is, the diffusion prevention layer 30 can be formed simply by making alterations to the mask-pattern which is used to form the second protective insulating layer 18.

However, when the material of the diffusion prevention layer 30 is an insulator or a semiconductor, the diffusion prevention layer 30 needs to be formed so as to expose a portion of the p-side ohmic electrode 15, in order to maintain the electrical contact between the p-side ohmic electrode 15 and the p-side pad electrode 19.

In the embodiment shown in FIG. 1, the electrical contact between the p-side ohmic electrode 15 and the p-side pad electrode 19 is secured by narrowing the area of the diffusion prevention layer 30 rather than the area of the p-side ohmic electrode 15, when the area is viewed from the top surface of the substrate.

Embodiment 2

In the present embodiment, the production process of the ridge waveguide semiconductor laser diode according to the present invention will be described.

FIGS. 3A to 3E are views from the top surface of the p-type nitride semiconductor layer of the ridge waveguide semiconductor laser diode according to the present invention, showing schematically the steps of the production process of the electrode and the other components.

Figure 3A:
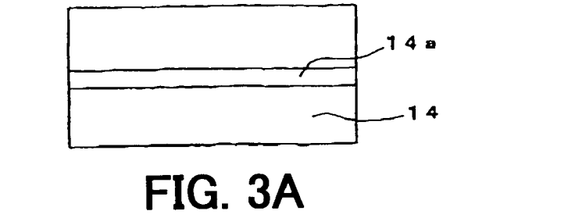
FIGS. 3A to 3E are the top views of the p-type semiconductor layer region of the ridge waveguide laser diode showing the process of forming the electrode and other components according to a second embodiment of the present invention.

First, the stripe ridge is constructed on the p-type nitride semiconductor layer, as shown in FIG. 3A. The ridge is constructed by removing a portion of the p-type nitride semiconductor layer by etching or the like, to form a protrusion.

The ridge can be either of a mesa shape or an inverted mesa shape. In the mesa shaped protrusion, the stripe width at the bottom is wider and it is narrowed toward the top face. On the contrary, in the inverted mesa shape, the stripe width is narrower toward the bottom. Also, the side face of the stripe may be perpendicular to the semiconductor layers.

Figure 3B:
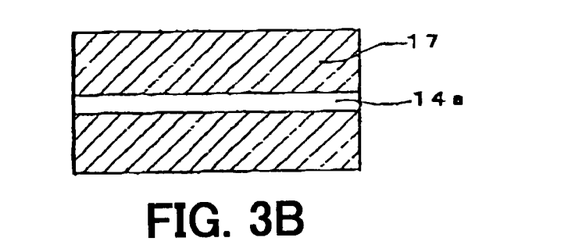

Next, the first protective insulating layer 17 is disposed as shown in FIG. 3B. This layer 17 covers the entire surface of the p-type nitride semiconductor layer 14 except for the top face of the ridge 14a (the first protective insulating layer 17 is shown in FIG. 3B as a shaded portion).

It is preferable to use a material having a large difference in the refractive index with the p-type nitride semiconductor 14. For example, $ZrO_2$, $SiO_2$, $Al_2O_3$, AlN, BN, DLC, C, MgO, SiN, SiON, CrO, ZnO, GaO, AlGaN, HfO, $Ta_2O_5$, or the like, can be used.

Figure 3C:
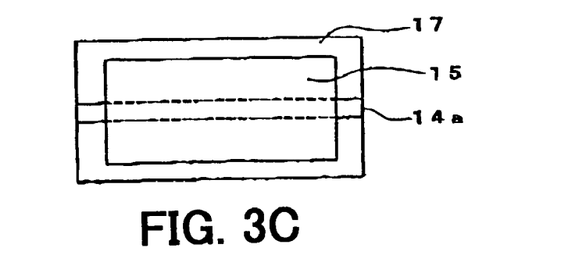

Next, as shown in FIG. 3C, the p-side ohmic electrode 15 is disposed so as to cover almost the entire surface of the p-type nitride semiconductor 14 and the first protective insulating layer 17. Thus, the ohmic contact between the p-type nitride semiconductor layer 14 and the p-side ohmic electrode 15 is established at the top face of the ridge 14a.

Figure 3D:
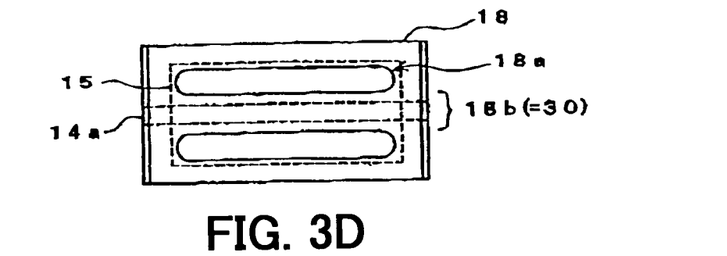

Next, the second protective insulating layer 18 and the diffusion prevention layer 30 are disposed simultaneously, as shown in FIG. 3D. That is, the second protective insulating layer 18 is disposed over a wider area than the p-side ohmic electrode 15. Further, the slender openings 18a parallel to the ridge are disposed on both sides of the ridge 14a.

The openings 18a are disposed so as to overlap at least the p-side ohmic electrode 15. It is preferable to dispose the openings 18a on the interior region of the p-side ohmic electrode 15. The diffusion prevention layer 30 is the region 18*b* sandwiched between the two openings 18*a*. Further, the second protective insulating layer 18 in FIG. 3D (also the diffusion prevention layer 30 in FIG. 2) is disposed so as to cover the side face of the laser diode chip except for the region of the n-type electrode.

The materials used for the second protective insulating layer 18 (as well as the diffusion prevention layer 30) include oxides such as $SiO_2$, ZrO, SiC, $TiO_2$, ZnO, $Al_2O_3$, DLC, C, MgO, SiON, CrO, ZnO, GaO, AlGaN, HfO, $Ta_2O_5$, $RhO_2$, $Nb_2O_5$, ITO, or nitrides such as AlN, BN, SiN, RhN, ZrN, TiN, ZnN, GaN, and NbN.

Figure 3E:
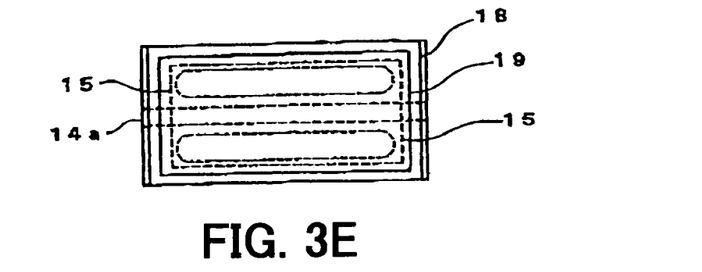

Next, as shown in FIG. 3E, the p-side pad electrode 19 is disposed on the internal region of the second protective insulating layer and the exterior region of the p-side ohmic electrode 15. The p-side pad electrode 19 electrically contacts with the p-side ohmic electrode 15 through the openings 18*a* provided in the second protective insulating layer 18.

By using the production method described above, the diffusion prevention layer 30 can be formed by simply changing the mask shape of the photolithography which is used to form the second protective insulating layer 18, without adding a new production process.

Next, the examples of the present invention will be described.

EXAMPLE 1

In the present invention, the components of the layered structure are not specifically limited, and various layered structures can be used for the n-type nitride semiconductor layer, the active layer, and the p-type nitride semiconductor layer. For example, the device structure described in the following example is used. Also, the materials used for the electrode and the insulating layer (protective layer) and the like are not specifically limited, and various sorts of materials can be used.

The nitride semiconductors used for the layered structure include the nitride semiconductors such as GaN, AlN, or InN, and the III-V nitride semiconductors (such as an $In_xAl_yGa_{1-x-y}N$ semiconductor, where $0 \leq x$, $0 \leq y$, and $x+y \leq 1$), which is a mixed crystal thereof.

The nitride semiconductor can be grown by any known method for forming the nitride semiconductor, such as MOVPE, MOCVD (metal organic chemical vapor deposition), HVPE (halide vapor phase epitaxy method), and MBE (molecular beam epitaxy method).

The semiconductor laser diode element using the nitride semiconductor will be described below. However, the semiconductor laser diode element according to the present invention is not limited to the nitride semiconductor, and various semiconductors can be used in accordance to the principles of the invention.

(Substrate)

In example 1, the sapphire with a principal face being the c-face is used for the substrate.

A substrate made by a nitride semiconductor such as GaN can be used in place of the foreign substrate such as the sapphire which is different than the nitride semiconductor. The foreign substrate other than the sapphire substrate whose principal face is the c-face includes substrate materials capable of growing nitride semiconductors. Such materials include for example, a sapphire substrate having either an r-face or an a-face as their principal face. These materials include a spinel, ZnS, ZnO, GaAs, Si, SiC and the oxide substrate where the lattice constant matches with the nitride semiconductor. The sapphire, and the spinel are preferably used as the foreign substrate.

(Buffer Layer)

The foreign substrate made of a c-face sapphire of two-inches in diameter is set in the MOVPE reactor. Then the buffer layer made of GaN is grown to the thickness of 200 Å at 500° C., using trimethylgallium (TMG) and ammonia ($NH_3$).

(Underlayer)

After growing the buffer layer, the nitride semiconductor layer made of undoped GaN is grown to the thickness of 4 µm at 1500° C., using TMG, and ammonia. This layer works as an underlayer (growth substrate) at the time of growing each layer which comprises the device structure. In addition to this, a growth substrate having excellent crystallinity can be obtained by using the underlayer of the nitride semiconductor grown by the ELOG (Epitaxially Laterally Overgrowth) method.

The following examples can be cited as a layer grown by the ELOG method. In an example, a nitride semiconductor layer is grown on the foreign substrate. Next, the stripes of the masking region and the non-masking region are formed on the surface of the nitride semiconductor layer, by depositing a protective layer whereon the nitride semiconductor is difficult to grow. Then, the nitride semiconductor is grown on the non-masking region, so that the lateral growth is achieved in addition to the thickness. Thus, a layer can be obtained where the nitride semiconductor is grown over the masked region.

In another example, an opening is formed on the nitride semiconductor layer grown on the foreign substrate. Then a layer is formed by growing the nitride semiconductor layer in the lateral direction from the side face of the opening.

(N-Type Contact Layer)

Next, the n-type contact layer of N-type AlGaN is grown to the thickness of 4.5 µm on the underlayer (nitride semiconductor substrate), where $1 \times 10^{18}/cm^3$ of Si is doped at 1050° C. while applying TMG, TMA, and ammonia, with the silane gas as the impurity gas. The n-type contact layer can be formed by an n-type nitride semiconductor layer other than AlGaN, such as GaN.

(Crack Preventing Layer)

Then, the crack preventing layer consisting of In0.06Ga0.94N is grown to the thickness of 0.15 µm, at 800° C. by using TMG, TMI trimethyl indium) and ammonia. This crack preventing layer can be omitted if desired.

(N-Type Cladding Layer)

Next, the layer A consisting of undoped AlGaN is grown to a thickness of 25 Å at 1050° C., using the source gas of TMA (trimethyl aluminium), TMG and ammonia. Then the supply of TMA is stopped, and the layer B of GaN doped with Si in a concentration of $5 \times 10^{18}/cm^3$ is grown to the thickness of 25 Å by using silane gas as the impurity gas.

This operation is repeated 160 times to stack the layer A and the layer B alternately to form the n-type cladding layer having a multilayer structure (super lattice structure) with the total thickness of 800 Å. In this time, the difference in the refractive index sufficient for functioning as the cladding layer can be obtained when the proportion of Al to the undoped AlGaN is in the range from 0.05 and above to 0.3 or less.

Further, a nitride semiconductor layer having a wider bandgap than the active layer and capable of supplying the electron is sufficient for the n-type cladding layer. The nitride semiconductor containing Al is preferable.

(N-Type Optical Guide Layer)

Next, the n-type optical guide layer of undoped GaN is grown to a thickness of 0.1 μm at a similar temperature as described above by using TMG and ammonia as the source gas. The n-type optical guide layer may be doped with an n-type impurity. The nitride semiconductor used in the optical guide layer is required only to have a difference in its refractive index large enough to form the waveguide, compare to the refractive index of the cladding layer formed outside thereof, and either a single layer or a multiple layer structure can be used. An undoped GaN is preferable for an oscillating wavelengths from 370 nm to 470 nm, and a multiple layer of InGaN/GaN is preferable for relatively longer wavelength (450 nm and above).

(Active Layer)

Next, the barrier layer of In0.05Ga0.95N doped with Si in the concentration of $5 \times 10^{18}$/cm$^3$ is grown to the thickness of 100 Å at 800° C., using TMI (trimethyl indium), TMG and ammonia as the source gases with silane gas as the impurity gas. Then the supply of silane gas is stopped and the well layer of undoped $In_{0.1}Ga_{0.9}N$ is grown to a thickness of 550Å. The active layer of the multiple quantum well structure (MQW) having a total thickness of 50 Å is formed by repeating this operation three times, and then, depositing the barrier layer thereon.

As for the active layer, it is preferable to use a nitride semiconductor layer that includes In. This composition obtains a laser beam in the range from violet to red in the ultraviolet and the visible regions. Meanwhile, in the case where the nitride semiconductor layer including In is used, if the active layer is exposed to the air, serious damage to the laser element may occur when it is activated. This is due to the low melting point of In, which causes decomposition and evaporation to take place, so that the layer is damaged by etching when the protrusion is formed. Thus, the crystallinity becomes difficult to be maintained in the process after exposing the active layer. Therefore, it is preferable to construct the stripe-shaped protrusion to a depth so as not to reach the active layer. The active layer may have a quantum well structure, and in that case, may be either a single quantum well or a multiple quantum well structure.

(P-Type Electron Confinement Layer)

Next, the P-type electron confinement layer of AlGaN doped with Mg in the concentration of $5 \times 10^{19}$/cm$^3$ is grown to the thickness of 100 Å at a similar temperature as described above, using TMA, TMG, and ammonium as the source gas, with Cp$_2$Mg (magnesium cyclopentadienyl) as the impurity gas.

(P-Type Optical Guide Layer)

Next, the p-type guide layer of undoped GaN is grown to a thickness of 750 Å at 1050° C., using TMG and ammonia as the source gas. The p-type optical guide layer is grown undoped, however, it may be doped with Mg. The nitride semiconductor used in the optical guide layer is required only to have a difference in its refractive index large enough to form the waveguide, compared to the refractive index of the cladding layer formed outside thereof, and either a single layer or a multiple layer structure can be used. An undoped GaN is preferable for an oscillating wavelength from 370 nm to 470 nm, and a multiple layer structure of InGaN/GaN is preferable for relatively longer wavelengths (450 nm and above).

(P-Type Cladding Layer)

Subsequently, the layer of undoped $Al_{0.16}Ga_{0.84}N$ is grown to a thickness of 25 Å at 1050° C., using the source gas of TMA (trimethyl aluminium), TMG and ammonia. Then the supply of TMA is stopped and the layer of GaN doped with Mg is grown to a thickness of 25 Å by using Cp$_2$Mg gas as the impurity gas. Thus, the p-type cladding layer consisting of the super lattice layer was grown to a total thickness of 0.6 μm.

In the case where the p-type cladding layer is a super lattice layer formed by laminating nitride semiconductor layers having different band gap energies to each other, and at least one of which contains Al, the crystallinity tends to be improved by so-called modulation doping, in which one of the layer is doped with impurities with a higher concentration. However, both layers can be similarly doped.

The nitride semiconductor layer used in the p-type cladding layer is required only to have a wider bandgap than that of the active layer, and is capable of supplying electrons. The nitride semiconductor containing Al is preferably used.

(P-Type Contact Layer)

Finally, the p-type contact layer of p-type GaN doped with Mg in a concentration of $15 \times 10^{20}$/cm$^3$ is grown at 1050° C. on the p-type cladding layer. The p-type contact layer may be formed by an $In_xAl_yGa_{1-x-y}N$ semiconductor, where $0 \leq x$, $0 \leq y$, and $x+y \leq 1$. It is most preferable if the ohmic contact with the p-electrode can be obtained by forming the layer by GaN doped with Mg. After the reaction, the wafer is annealed in the reactor in a nitrogen atmosphere at 700° C. to reduce the electrical resistance of the p-type contact layer.

(Exposure of the N-Type Contact Layer and Formation of the Resonator)

The laminated structure is constructed by growing the nitride semiconductor as described above. Then, the wafer is taken out from the reactor, and the protective layer consisting of SiO$_2$ is formed on the top layer of the p-type contact layer. Next, the surface of the n-type contact layer is exposed by etching using SiCl$_4$ gas by way of RIE (reactive ion etching). The n-electrode is disposed on the exposed surface of the n-type contact layer. At the same time, the end face of the active layer is exposed by etching so as to form the resonator end face.

(Formation of the Ridge)

Next, to form the region for the stripe ridge, the protective layer of Si oxide (mainly SiO$_2$) is disposed to a thickness 0.5 μm over almost the entire surface of the top layer of the p-type contact layer using CVD. Then, a mask having a predetermined form is disposed on the protective layer by way of photolithography, and the stripe-shaped protective layer is constructed by RIE using CF$_4$ gas. After forming the stripe-shaped protective layer, the photoresist is removed by etching.

Another etching is carried out on the p-type contact layer and the p-type cladding layer by way of RIE using SiCl$_4$, and the ridge 14a having a stripe width of 2 μm is formed.

(First Protective Insulating Layer)

Next, the first protective insulating layer 17 of ZrO$_2$ is disposed on the p-type semiconductor layer while the SiO$_2$ mask is left on. The first protective insulating layer 17 may be disposed on the entire surface of the semiconductor layer by masking the region for forming the n-side ohmic electrode. Further, the portion is set so as not to form the protective insulating layer 17 thereon and this eases the subsequent dividing operation.

After forming the first protective insulating layer 17, the wafer is dipped in a buffered solution to dissolve and remove the SiO$_2$ which is disposed on the stripe-shaped protrusion 14a. The ZrO$_2$ layer 17 on the ridge 14a (also, on the n-type contact layer) is removed with SiO$_2$ by the lift off method. Thus, the top face of the ridge 14a is exposed, and the side face of the ridge 14a is covered with ZrO$_2$ 17.

(Ohmic Electrodes)

Next, the p-side ohmic electrode 15 is formed on the first protective insulating layer 17. The p-side ohmic electrode 15 is formed on the inner region rather than on the p-type nitride semiconductor layer 14. This p-side ohmic electrode 15 is made of Ni—Au. Also, the stripe-shaped n-side ohmic electrode 16 is formed on the n-type contact layer which is exposed by the etching. The n-side ohmic electrode 16 is made of Ti—Al. After these electrodes are formed, an annealing process is carried out at 600° C. in an atmosphere of oxygen and nitrogen with a ratio of 80:20, respectively, so as to make both the p-side and the n-side ohmic electrodes to alloy. Thus, excellent ohmic properties can be obtained.

(Second Protective Insulating Layer, Diffusion Prevention Layer)

Next, a resist is coated on the strips on both sides and parallel to the ridge 14a on the p-side ohmic electrode 15, and a portion of the n-side ohmic electrode 16. The second protective insulating layer 18 comprising an oxide of Si (mainly SiO$_2$) is disposed on the entire surface of the wafer except for a portion for dividing them into chips.

Then, the second protective insulating layer 18 having two openings 18a is constructed by lift-off of the resist, as shown in FIG. 3D. The region sandwiched by the openings 18a of the second protective insulating layer 18 is the diffusion prevention layer 30.

(Pad Electrode)

Next, the p-side pad electrode 19 and the n-side pad electrode 29 are formed respectively, to cover the protective insulating layer. The p-side pad electrode 19 is formed to be wider than the p-side ohmic electrode 15 and narrower than the second protective insulating layer 18. By this construction, the ohmic contact between the p-side pad electrode 19 and the p-side ohmic electrode 18 can be obtained through the openings 18a which are formed in the second protective insulating layer 18. The p-side pad electrode 19 and the n-side pad electrode 29 are made of Ni—Ti—Au. These pad electrodes contact the exposed ohmic electrodes 15 and 16 in the stripe-shaped portion.

After forming the pad electrodes as described above, the first resist layer is disposed on the entire surface of the wafer except for the portion for dividing into chips. Next, the SiO$_2$ mask is formed on the entire surface of the wafer. The second resist layer is disposed on the SiO$_2$ mask. At this point, patterning is carried out for the second resist layer on the portion close to the surface of the resonator of the light emitting side for further etching. The second resist layer may extend to the end face of the semiconductor layer.

After the mask is formed in the sequence of the first resist layer—SiO$_2$ layer—the second resist layer, etching is carried out. First etching is done to the SiO$_2$ layer by using CHF$_3$ as the etching gas. Then etching is done to the semiconductor layer, by using the resulting SiO$_2$ pattern as the mask, until the substrate is exposed. SiCl$_4$ is used as the etching gas for the etching of the semiconductor layer. Thus, the exposed portion of SiO$_2$ which is not covered with the second resist layer and the semiconductor layer beneath it can both be etched. Next, the first resist layer, SiO$_2$, and the second resist layer are removed. By this treatment, an end face can be made which is an n-type semiconductor layer exposed from the end face of the resonator.

(Dividing into Bars)

After the p-side ohmic electrode and the n-side ohmic electrode are formed, as described above, the substrate is polished to a total thickness including the substrate of 200 μm. The backmetal made of Ti—Pt—Au is made on the rear surface thereof. Then the wafer is divided to bars from the substrate side, along a line perpendicular to the stripe-shaped electrodes. The dividing in the later process can be made easily, at this point which is before dividing the wafer into bars, by scribing the rear surface of the substrate in the portion that will be subsequently divided. As for the method of scribing, mechanical or physical scribing using a blade such as a cutter knife, or optical or thermal scribing using a YAG laser and the like, can be used.

(Mirror on the Light Reflection Side)

In the semiconductor divided into bars as described above, the resonator surfaces of light emission side are lined on one side of the bars, and the resonator surfaces of the light reflection side are lined on another side of the bars. Several of such bars are arranged so that the resonator surfaces of the light emission side and the resonator surfaces of light reflection side respectively face the same direction. Then, the bars are disposed on the deposition jig with the spacers interposed between the two bars, so as not to leave a space therebetween. Thus, by having the spacers interposed between the bars, the formation of the protective layer on the electrodes formed on the diode element can be prevented. First, ZrO$_2$ and the six pairs of (SiO$_2$/ZrO$_2$) are formed on the resonator surface of the light reflection sides, and a mirror is formed. Thus, the ridge waveguide nitride semiconductor laser diode is constructed.

(Mounting)

Next, the ridge waveguide semiconductor laser diode is mounted face-down on the mounting substrate. The Sn/Au bumps 23 are disposed on the mounting electrode of the mounting substrate as the conductive joining material. The p-side pad electrode 19 and the n-side pad electrode 29 of the laser diode chip are made in contact with the Sn/Au bumps 23 and are heated. Thus, the laser diode chip is mounted.

The nitride semiconductor laser diode described above exhibits an output power of about 60 mW, and a threshold current of about 40 mA. The thermal resistance and the driving current are decreased in the semiconductor laser diode according to the current invention, so that reliability of operation in a high temperature is improved, and moreover, the life performance is improved.

EXAMPLE 2

In Example 2, the second protective insulating layer and the diffusion prevention layer are constructed separately, and SiN is used as the material for the diffusion prevention layer. The construction of the second protective insulating layer and the diffusion prevention layer will be described below. In Example 2, a semiconductor laser diode element using the nitride semiconductor was otherwise constructed in the same manner as in Example 1.

(Second Protective Insulating Layer)

Almost the entire surface of the p-side ohmic electrode and a portion of the n-side ohmic electrode are coated with the resist in the direction perpendicular to the ridge. The second protective insulating layer made of an oxide of Si (mainly SiO$_2$) is disposed on the entire surface of the wafer except for the portion for dividing the wafer into chips. Subsequently, the resist is removed by lift-off so as to expose almost the entire surface of the p-side ohmic electrode including the ridge and a portion of the n-side ohmic electrode. Thus, the second protective insulating layer is formed.

(Diffusion Prevention Layer)

Next, on the p-side ohmic electrode, the diffusion prevention layer of SiN is formed so as to cover the entire top face of the ridge and to expose a portion of the p-side ohmic electrode. In the present example, the p-pad electrode comes in contact with the p-side ohmic electrode on the exposed portion of the p-side ohmic electrode. For the patterning of the diffusion prevention layer, for example, the lift-off method using a resist can be used.

In the nitride semiconductor laser diode thus constructed, as in Example 1, the thermal resistance and the driving current are decreased so that reliability of operation in a high temperature is improved, and moreover, the life performance is improved.

COMPARATIVE EXAMPLE

A nitride semiconductor laser diode is constructed in the same manner as Example 2, without forming the diffusion prevention layer. In this case, there were spots which failed to emit in the minute electric current region, and also an irregularity of the emission within the waveguide occurred.

EXAMPLE 3

A nitride semiconductor laser diode is constructed in the same manner as Example 1 except that the width of the stripe ridge is 5 μm, the output power is 100 mW, and the threshold current is 70 mA. In the nitride semiconductor laser diode thus constructed, as in Example 1, the thermal resistance and the driving current are decreased and thus the reliability of operation in a high temperature improved, and moreover, the life performance improved.

EXAMPLE 4

In the present example, the present invention is applied to the multistripe lasers. The nitride semiconductor laser diode is constructed in the same manner as Example 1, except for the points described below.

Figure 4:
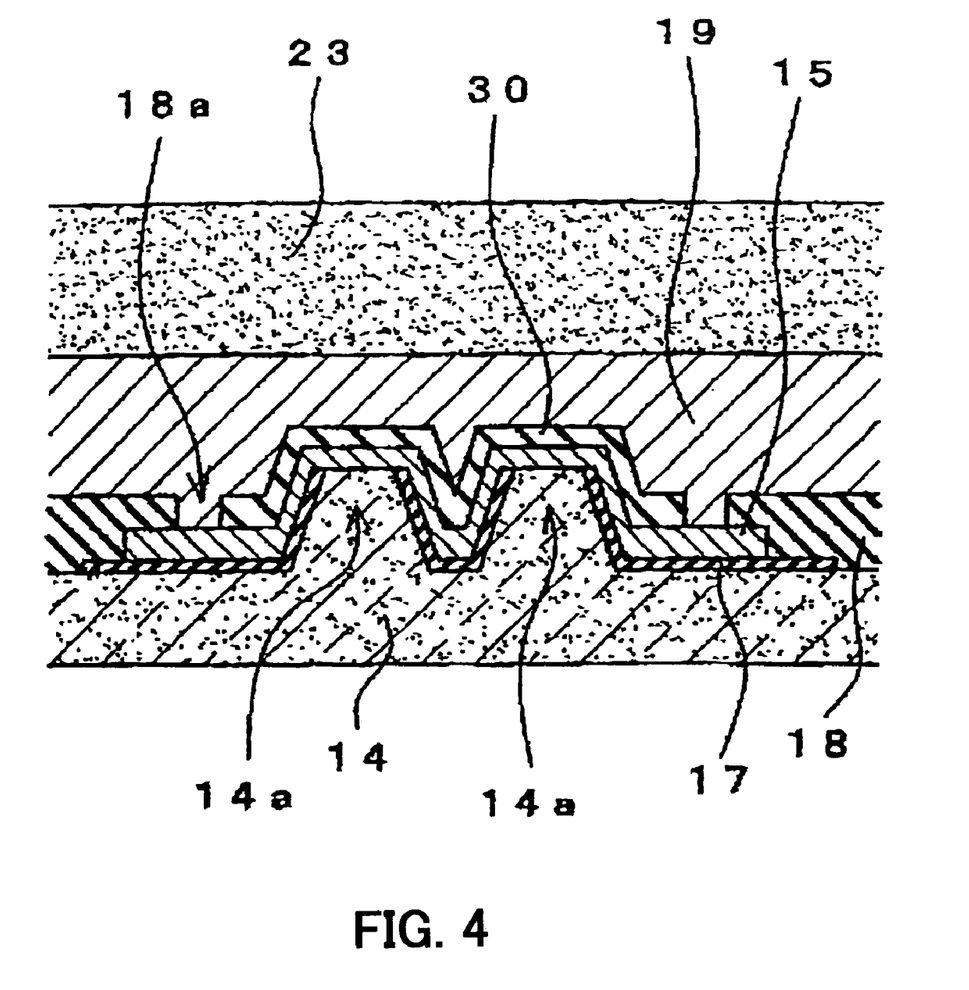
FIG. 4 is a schematic cross sectional view showing the structure of the ridge portion of the ridge waveguide laser diode according to Example 4 of the present invention.

First, as shown in FIG. 4, two parallel stripe ridges 14a each having a width of 3 μm are disposed at the interval of 2 μm. Next, the first protective insulating layer 17 of ZrO$_2$ is disposed so as to expose the top face of the ridge 14a. The p-side ohmic electrode 15 of Ni—Au is disposed on the first protective insulating layer 17. In the current example, the p-side ohmic electrode 15 is disposed continuously so as to cover the top faces of the two ridges 14a.

Next, the second protective insulating layer 18 and the diffusion prevention layer 30 are disposed on the ridges so as to possess the openings 18a. When the two ridges are seen as a unit, the openings are made to the outermost portion in parallel with the longitudinal direction of the unit. That is, in FIG. 4, an opening is made to the left of the left ridge 14a and another opening is made to the right of the right ridge 14a.

When the p-side pad electrode 19 is disposed so as to cover the second protective insulating layer 18 and the diffusion prevention layer 30 is formed as described above, the ohmic contact can be established between the p-side pad electrode 19 and the p-side ohmic electrode 15 through the openings 18a.

The laser diode constructed as described above exhibits an output power of 100 mW, and a threshold current of 100 mA. Also as in Example 1, the thermal resistance and the driving current are decreased and thus the reliability of operation in a high temperature improved, and moreover, the life performance improved.

As described above, in the multistripe laser diode having a plurality of ridges, it is preferable to dispose the p-side ohmic electrode continuously over the plurality of the ridges. It is also preferable to form the diffusion prevention layer 30 so as to expose the p-side ohmic electrode in the outermost region in parallel with the longitudinal direction of the ridge portion where a plurality of ridges are lined. Thus, the ohmic contact is established between the p-side ohmic electrode and the p-side pad electrode in the outermost region thereof.

In other words, in the case where a plurality of ridges are disposed side by side, the p-side ohmic electrode and the diffusion prevention layer are formed continuously between the ridges. The p-side ohmic electrode is exposed from the diffusion prevention layer at the outermost region parallel to the longitudinal direction of the ridge portion having a plurality of ridges, so that the electric connection to the p-side pad electrode is secured.

By this construction, even in the case where the interval between the ridges is narrow, each corner of the ridges is sufficiently covered by the diffusion prevention layer 30, and the electrical contact between the p-side pad electrode and the p-side ohmic electrode can be secured. Thus, the radius of the spot size can be reduced by narrowing the interval between the ridges.

In cases where the intervals between the ridges are wide, or where there is no need for covering the corners of the ridges with the diffusion prevention layer 30, it is possible to dispose the p-side ohmic electrode or the diffusion prevention layer discontinuously. This establishes the electric contact between the p-side electrode and the p-side pad electrode on either side of each ridge 14a.

EXAMPLE 5

In the present example, the present invention is applied not to the gallium nitride laser diode, but to a laser diode using a gallium arsenide semiconductor. The present example differs from Examples 1 to 4, in that the n-electrode is disposed on the reverse face of the substrate. However, the mounting is done with the p-side electrode side downwardly, so that the present invention can be applied in the same way as in Examples 1 to 4.

On the n-InGaP substrate, the n-InP cladding layer, the n-InGaAsP guide layer, the InGaAsP active layer, the p-InGaAsP guide layer, the p-InP cladding layer, and the p-InGaAsP contact layer are laminated in sequence. The ridge is constructed by etching to the p-InP cladding layer. The p-side ohmic electrode made of Au/Zn is disposed on the p-InGaAsP contact layer, and the n-side ohmic electrode made of Au/Ge is disposed on the reverse face of the substrate of n-InGaP. Next, the diffusion prevention layer made of SiO$_2$ and the like is disposed on the p-side ohmic electrode so as to cover the juncture between the p-side ohmic electrode and the p-InGaAsP contact layer.

After the pad electrodes are disposed on the p-side ohmic electrode and the n-side ohmic electrode, bonding is carried out to the mounting substrate or the lead frame with the p-side on the downward side. Then another bonding process is carried out for the n-side pad electrode. The reason for bonding the p-electrode on the downward side is that the thermal conductivity of GaAs is poorer than GaN and it is advantageous to radiate heat from the P-type layer which is closer to the active layer.

The lifetime of the element is improved in the GaAs laser diode constructed as described above, when compared with the conventional laser diode in which the diffusion prevention layer is not formed.

Although the present invention is described in such cases where the present invention is applied to the GaN or GaAs ridge waveguide semiconductor laser diodes hitherto, the present invention is not so limited. For example, the present invention can be applied to the ridge waveguide semiconductor laser diodes, in the same way as described in the examples. Such semiconductors include the III-V compound semiconductors other than GaN or GaAs, and the II-VI compound semiconductors such as InP, ZnSe and the like.

The present invention can be applied to all kinds of devices using a laser diode element. For example, the present invention can be used in a CD player, an MD player, various game machines, a DVD player, a key line-optical communications system such as the telephone lines and the undersea cables, medical equipment such as a laser surgical device, laser therapy equipment, and a laser acupressure device, a laser printer, a laser display, a photosensor such as a measuring instrument, a laser level instrument, a laser end-measuring machine, a laser speed gun, a laser thermometer, and a laser electric power transportation device.

This application is based on Japanese Patent Application No. 2003-340625 filed on Nov. 25, 2002, and Japanese Patent Application No. 2003-305555 filed on Aug. 28, 2003, the contents of which are incorporated hereinto by reference.

What is claimed is:

1. A ridge waveguide semiconductor laser diode comprising:
   an n-type semiconductor layer;
   a p-type semiconductor layer having a ridge forming a waveguide;
   an active layer disposed between said n-type semiconductor layer and said p-type semiconductor layer;
   a protective insulating layer partially covering said ridge so as to expose at least a portion of a top face of said ridge;
   a p-side ohmic electrode in ohmic contact with said portion of said ridge;
   a p-side pad electrode disposed so as to electrically connect to said p-side ohmic electrode; and
   an intermediate layer is disposed between said p-side ohmic electrode and said p-side pad electrode so as to cover a portion of said p-side ohmic electrode including an area that covers said top face of said ridge.

2. The ridge waveguide semiconductor laser diode according to claim 1, wherein said intermediate layer includes diffusion prevention means for preventing diffusion of a low melting point metal.

3. The ridge waveguide semiconductor laser diode according to claim 1, wherein said intermediate layer is a buffer layer for adjusting adhesion.

4. The ridge waveguide semiconductor laser diode according to claim 1, wherein said intermediate layer further covers another portion of said p-side ohmic electrode that covers side faces of said ridge.

5. The ridge waveguide semiconductor laser diode according to claim 1, wherein said intermediate layer includes at least one of an oxide, a nitride, and a high melting point metal.

6. The ridge waveguide semiconductor laser diode according to claim 1, wherein said intermediate layer is an insulator.

7. The ridge waveguide semiconductor laser diode according to claim 1, wherein said intermediate layer is at least one selected from the group consisting of $SiO_2$, $TiO_2$, $ZrO_2$, AlN, SiN, GaN, AlGaN, InGaN and Pt.

8. The ridge waveguide semiconductor laser diode according to claim 1, wherein said intermediate layer is a single layer structure.

9. The ridge waveguide semiconductor laser diode according to claim 1, wherein said intermediate layer includes a multilayer structure comprising at least two layers.

10. The ridge waveguide semiconductor laser diode according to claim 1, wherein said protective insulating layer comprises a first protective insulating layer and said ridge waveguide semiconductor laser diode further comprises a second protective insulating layer disposed on a portion of said first protective insulating layer, and wherein said intermediate layer and said second protective insulating layer have the same composition.

11. The ridge waveguide semiconductor laser diode according to claim 10, wherein a width and a length of said intermediate layer are substantially equal on both sides of said ridge.

12. The ridge waveguide semiconductor laser diode according to claim 1, further comprising a conductive joining material including a low melting point metal bonded to said p-side pad electrode in the vicinity of said ridge.

13. The ridge waveguide semiconductor laser diode according to claim 1, wherein said ridge waveguide semiconductor laser diode comprises an $In_xAl_yGa_{1-x-y}N$ semiconductor, where $0 \leq x$, $0 \leq y$, and $x+y \leq 1$.

14. The ridge waveguide semiconductor laser diode according to claim 1, wherein said intermediate layer is a buffer layer for adjusting adhesion and said intermediate layer includes diffusion prevention means for preventing diffusion of a low melting point metal.

15. A ridge waveguide semiconductor laser diode comprising:
   an n-type semiconductor layer;
   a p-type semiconductor layer having a ridge forming a waveguide;
   an active layer disposed between said n-type semiconductor layer and said p-type semiconductor layer;
   a protective insulating layer partially covering said ridge so as to expose at least a portion of a top face of said ridge;
   a p-side ohmic electrode in ohmic contact with said portion of said ridge;
   a p-side pad electrode disposed so as to electrically connect to said p-side ohmic electrode; and
   an intermediate layer is disposed between said p-side ohmic electrode and said p-side pad electrode so as to cover a portion of said p-side ohmic electrode including an area that covers the top face of said ridge, wherein said intermediate layer includes a diffusion prevention means for preventing diffusion of a low melting point.

16. A ridge waveguide semiconductor laser diode comprising:
   an n-type semiconductor layer;
   a p-type semiconductor layer having a ridge forming a waveguide;
   an active layer disposed between said n-type semiconductor layer and said p-type semiconductor layer;
   a protective insulating layer partially covering said ridge so as to expose at least a portion of a top face of said ridge;
   a p-side ohmic electrode in ohmic contact with said portion of said ridge;
   a p-side pad electrode disposed so as to electrically connect to said p-side ohmic electrode; and
   an intermediate layer is disposed between said p-side ohmic electrode and said p-side pad electrode so as to cover a portion of said p-side ohmic electrode including an area that covers the top face of said ridge and said intermediate layer is an insulator.

17. The waveguide semiconductor laser diode according to claim 16, wherein said intermediate layer is at least one compound selected from the group consisting of $SiO_2$, $TiO_2$, $ZrO_2$, AlN, SiN, GaN, AlGaN and InGaN.

18. The ridge waveguide semiconductor laser diode according to claim 16, wherein said intermediate layer is a single layer structure.

19. The ridge waveguide semiconductor laser diode according to claim 16, wherein said intermediate layer includes a multilayer structure comprising at least two layers.

20. The ridge waveguide semiconductor laser diode according to claim 16, wherein said ridge waveguide semiconductor laser diode comprises an $In_xAl_yGa_{1-x-y}N$ semiconductor, where $0 \leq x$, $0 \leq y$, and $x+y \leq 1$.

* * * * *